(12) United States Patent
Hyun

(10) Patent No.: US 8,048,739 B2
(45) Date of Patent: Nov. 1, 2011

(54) METHOD OF MANUFACTURING FLASH MEMORY DEVICE

(75) Inventor: Chan Sun Hyun, Kyeongki-do (KR)

(73) Assignee: Hynix Semiconductor Inc., Icheon-si (KR)

( * ) Notice: Subject to any disclaimer, the term of this patent is extended or adjusted under 35 U.S.C. 154(b) by 63 days.

(21) Appl. No.: 11/479,084

(22) Filed: Jun. 30, 2006

(65) Prior Publication Data

US 2007/0148864 A1   Jun. 28, 2007

(30) Foreign Application Priority Data

Dec. 23, 2005   (KR) .......................... 10-2005-128763

(51) Int. Cl.
*H01L 21/336* (2006.01)
(52) U.S. Cl. ........ 438/259; 438/248; 438/391; 438/700; 438/647; 438/314; 438/257; 438/258; 438/260; 438/261; 438/262; 438/263; 438/264; 438/265; 438/266; 438/267
(58) Field of Classification Search .................. 438/248, 438/391, 700, 647, 257–267, 314
See application file for complete search history.

(56) References Cited

U.S. PATENT DOCUMENTS

| | | | |
|---|---|---|---|
| 6,573,139 B2 | 6/2003 | Lee et al. | |
| 6,720,610 B2 * | 4/2004 | Iguchi et al. | 257/315 |
| 2001/0024887 A1 * | 9/2001 | Graves et al. | 438/798 |
| 2003/0124800 A1 | 7/2003 | Park et al. | |
| 2004/0099900 A1 | 5/2004 | Iguchi et al. | |
| 2004/0102005 A1 * | 5/2004 | Dong et al. | 438/257 |
| 2004/0214430 A1 * | 10/2004 | Ruelke et al. | 438/687 |
| 2004/0266111 A1 | 12/2004 | Lee | |
| 2004/0266135 A1 | 12/2004 | Dong et al. | |
| 2005/0042859 A1 * | 2/2005 | Yu et al. | 438/636 |
| 2005/0047261 A1 * | 3/2005 | Kai et al. | 365/232 |
| 2005/0056895 A1 * | 3/2005 | Shimizu et al. | 257/355 |
| 2005/0095784 A1 | 5/2005 | Yang | |
| 2005/0167745 A1 | 8/2005 | Ishida et al. | |
| 2006/0017093 A1 * | 1/2006 | Kwon et al. | 257/315 |
| 2006/0128099 A1 * | 6/2006 | Kim et al. | 438/258 |

FOREIGN PATENT DOCUMENTS

JP   10-289990   10/1998

* cited by examiner

*Primary Examiner* — N Drew Richards
*Assistant Examiner* — Jae Lee
(74) *Attorney, Agent, or Firm* — Kilpatrick Townsend & Stockton LLP

(57) ABSTRACT

According to yet another embodiment, a method for forming a non-volatile memory device includes etching a substrate to form first and second trenches. The first and second trenches are filled with an insulating material to form first and second isolation structures. A conductive layer is formed over the first and second isolation structures and between the first and second isolation structures to form a floating gate. The conductive layer and the first isolation structure are etched to form a third trench having an upper portion and a lower portion, the upper portion having vertical sidewalls and the lower portion having sloping sidewalls. The third trench is filled with a conductive material to form a control gate.

16 Claims, 2 Drawing Sheets

METHOD OF MANUFACTURING FLASH MEMORY DEVICE

BACKGROUND

The present invention generally relates to a method of manufacturing semiconductor memory devices, and more particularly, to a method of manufacturing a flash memory device, to reduce the inter-cell interference of NAND flash memory devices by employing a Self-Aligned Shallow Trench Isolation (SA-STI) process.

In a NAND flash memory device, a plurality of cells for storing data are connected in series to form one string. A drain select transistor and a source select transistor are formed between the cell string and the drain, and between the cell string and the source, respectively. A cell of the NAND flash memory device is formed by forming a gate in which a tunnel oxide film, a floating gate, a dielectric layer, and a control gate are sequentially laminated on a semiconductor substrate and forming junction units at both sides of the gate.

In the NAND flash memory device, the state of the cell is influenced by the operations of neighboring cells. It is therefore very important to constantly maintain the state of the cell. When the state of the cells is changed by the operations of neighboring cells (more particularly, the program operation), this phenomenon is referred to as an "interference phenomenon". In more detail, the term "interference phenomenon" refers to a phenomenon in which in the case where a second program adjacent to a first cell to be read is programmed, a threshold voltage higher than that of the first cell is read due to the capacitance operation incurred by variation in the charges of the floating gate of the second cell when the first cell is read.

In other words, the interference phenomenon refers to a phenomenon in which the state of an actual cell looks distorted by variation in the state of a neighboring cell even though the charges of the floating gate of the read cell are not changed. The state of the cell is changed by the interference phenomenon. This results in an increased failure ratio and a lower yield. Accordingly, it is effective to maintain constantly the state of the cell in order to minimize the interference phenomenon.

Meanwhile, in the manufacture process of a general NAND flash memory device, portions of the isolation structure and the floating gate are formed by the SA-STI process. The SA-STI process will be described in short below.

After a tunnel oxide film and a first polysilicon layer are formed on a semiconductor substrate, the first polysilicon layer and a predetermined region of the tunnel oxide film are etched. The semiconductor substrate is etched to a predetermined depth, forming a trench. An insulating layer is filled into the trench and a polishing process is performed to form an isolation structure.

A second polysilicon layer is formed on the entire structure. The second polysilicon layer is patterned in such a way to be partially overlapped with the isolation structure, thus forming a floating gate in which the first and second polysilicon layers are laminated. In order to completely remove the etch remnants of the second polysilicon layer, the second polysilicon layer is over-etched. Accordingly, the isolation structure is etched to a predetermined depth. It is therefore necessary to perform sufficient over-etch in order to completely remove the etch remnants of the second polysilicon layer. An amount of the isolation structure that is removed is about 100 Å. After a dielectric layer is formed on the entire structure, a third polysilicon layer for a control gate is formed.

If the flash memory device is fabricated using the SA-STI process as described above, the isolation structure is formed between the first polysilicon layer serving as the floating gate and a neighboring first polysilicon layer. Therefore, interference may occur between the first polysilicon layers.

In addition, the isolation structure is etched to a predetermined depth and the distance between the semiconductor substrate of the active region and the control gate is narrowed accordingly. Accordingly, cycling fail may occur because the semiconductor substrate is influenced by the control gate.

SUMMARY OF THE INVENTION

An embodiment of the present invention provides a method of manufacturing a flash memory device in order to minimize interference between the first polysilicon layers that occurs when the isolation structure is over-etched while the SA-STI process is performed.

Another embodiment of the present invention provides a method of manufacturing a flash memory device, in order to prevent cycling fail that is generated as the isolation structure is over-etched while the SA-STI process is performed and the distance between the semiconductor substrate and the control gate of the active region is narrowed accordingly.

According to an embodiment of the present invention, a method of manufacturing a flash memory device includes the steps of: (a) sequentially forming a tunnel oxide film and a first polysilicon layer at a predetermined region on a semiconductor substrate, and forming an isolation structure to a predetermined region on the semiconductor substrate; (b) forming a second polysilicon layer over the first polysilicon layer and the isolation structure, and patterning the second polysilicon layer so that second polysilicon layer is partially overlapped with the isolation structure, whereby the isolation structure is partially etched; (c) etching the isolation structure to a predetermined depth under the conditions in which a polymer is generated; and (d) forming a dielectric layer and a third polysilicon layer over the isolation structure and the second polysilicon layer, and patterning the dielectric layer and the third polysilicon layer.

Step (c) may be performed using an oxide film etch chamber under the conditions in which the etch rate of the second polysilicon layer is low, but the etch rate of the isolation structure is high.

In step (c), the isolation structure may be etched to have a V shape.

Step (c) may be performed using a mixed gas of $CF_4$, $CHF_3$, $CF_8$, and $CH_2F_2$.

Furthermore, step (c) may be performed by introducing $CF_4$ of about 50 sccm to about 200 sccm, $CHF_3$ of about 20 sccm to about 200 sccm, $CF_8$ of about 5 sccm to about 30 sccm, and $CH_2F_2$ of about 10 sccm to about 50 sccm, and then introducing argon (Ar) gas of about 100 sccm or less into an oxide film etch chamber, and applying a bias of about 200 W or less.

Step (c) may be performed so that the isolation structure is etched to have the same height as a surface height of the semiconductor substrate.

According to an embodiment of the present invention, a method of manufacturing a flash memory device includes: sequentially forming a tunnel oxide film and a first polysilicon layer at a predetermined region on a semiconductor substrate, and forming an isolation structure at a predetermined region on the semiconductor substrate; forming a second polysilicon layer on the entire structure, and patterning the second polysilicon layer so that second polysilicon layer is partially overlapped with the isolation structure in a polysilicon etch chamber, whereby the isolation structure is partially etched; etching the isolation structure in a V shape of a predetermined depth under the conditions in which polymer is generated in an oxide film etch chamber; and forming a dielectric layer and a third polysilicon layer on the entire structure and patterning the dielectric layer and the third polysilicon layer.

According to yet another embodiment, a method for forming a non-volatile memory device includes etching a substrate to form first and second trenches. The first and second trenches are filled with an insulating material to form first and second isolation structures. A conductive layer is formed over the first and second isolation structures and between the first and second isolation structures to form a floating gate. The conductive layer and the first isolation structure are etched to form a third trench having an upper portion and a lower portion, the upper portion having vertical sidewalls and the lower portion having sloping sidewalls. The third trench is filled with a conductive material to form a control gate.

The third trench is formed using first and second etch steps, wherein the first etch step is used to form the upper portion of the third trench and the second etch step is used to form the lower portion of the third trench. The second etch step uses an etch gas that generates polymer during the etching process. The etch gas of the second etch step includes $CF_4$, $CHF_3$, $CF_8$, or $CH2F_2$. The etch gas of the second etch step includes a combination of selected from $CF_4$, $CHF_3$, $CF_8$, and $CH_2F_2$.

DETAILED DESCRIPTION OF EMBODIMENTS

Figure 1A:
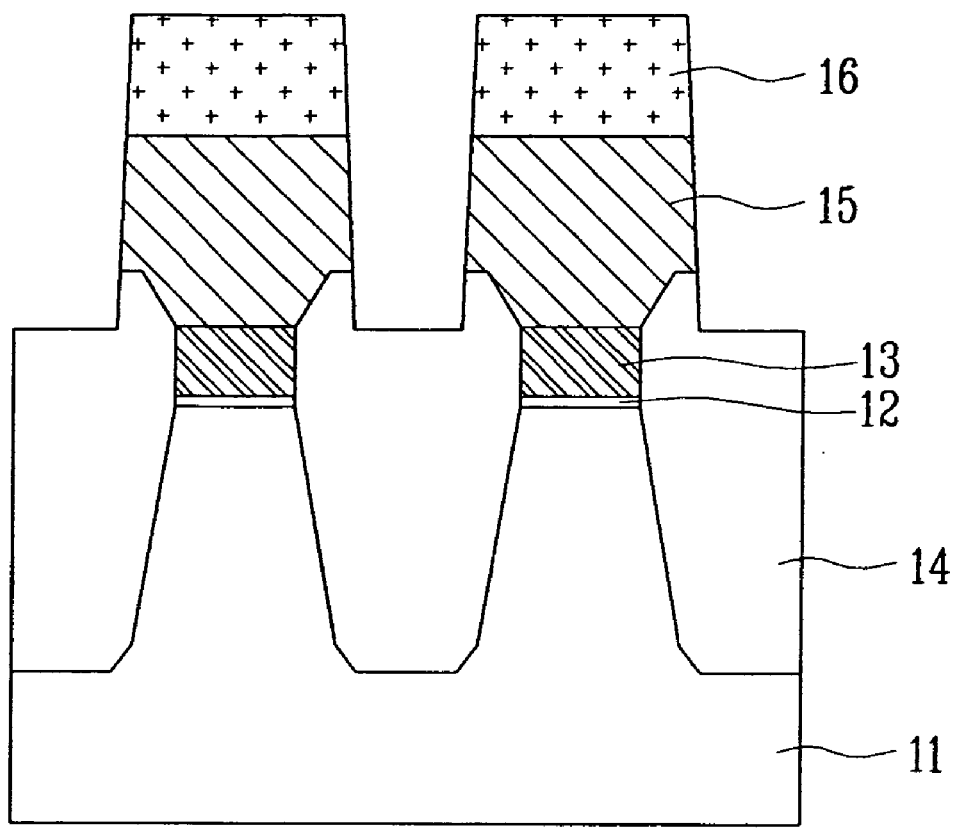
FIGS. 1A to 1C are cross-sectional views illustrating a method of manufacturing a flash memory device according to an embodiment of the present invention.
Figure 1B:
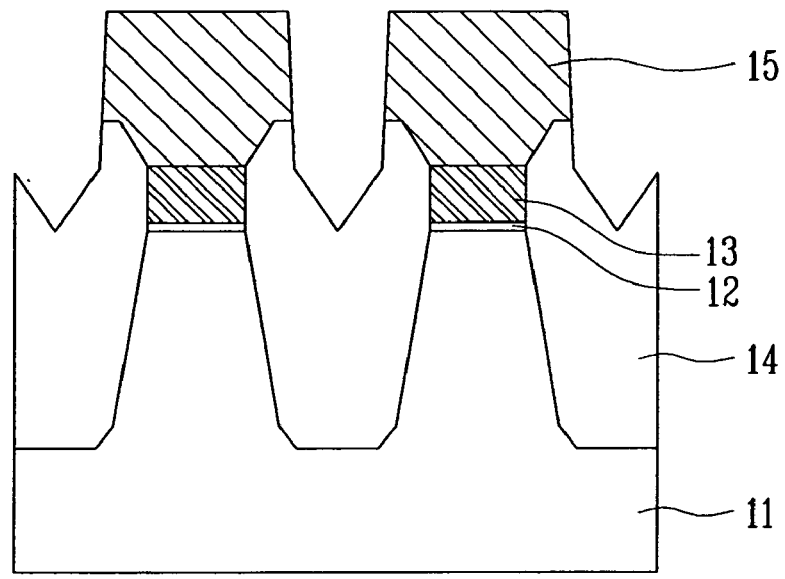
Figure 1C:
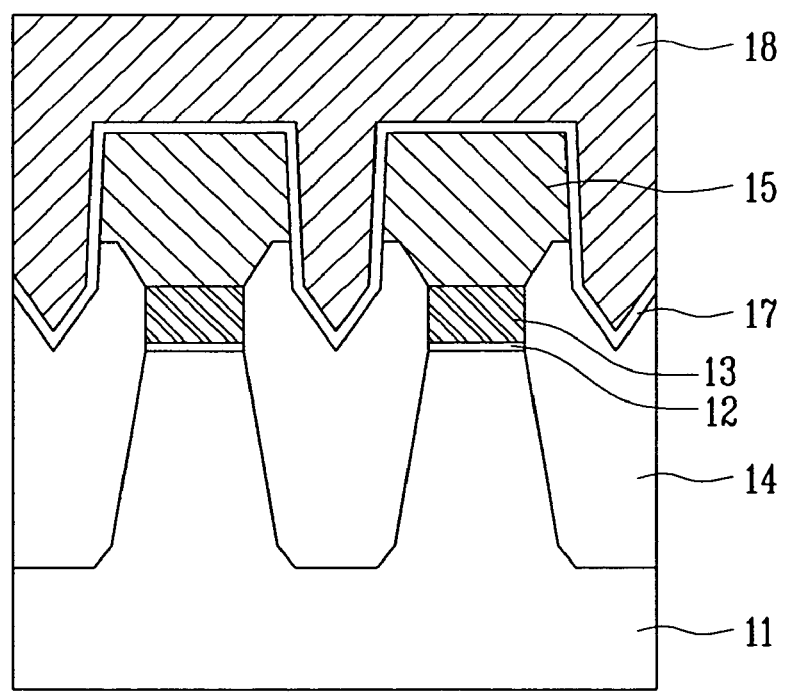

FIGS. 1A to 1C are cross-sectional views illustrating a method of manufacturing a flash memory device according to an embodiment of the present invention.

Referring to FIG. 1A, a tunnel oxide film 12 and a first polysilicon layer 13 are sequentially formed on a semiconductor substrate 11. A hard mask film (not shown) is formed on the first polysilicon layer 13. The hard mask film (not shown) is patterned by a photolithography process employing an isolation mask. The first polysilicon layer 13, the tunnel oxide film 12, and the semiconductor substrate 11 are etched to a predetermined depth using the patterned hard mask film (not shown) as a mask, thus forming trenches.

An insulating layer is formed to fill the trenches and is then polished so that the hard mask film (not shown) is exposed. An isolation structure 14 is formed by stripping the hard mask film (not shown). A second polysilicon layer 15 is formed on the entire structure. A photoresist film 16 is formed on the second polysilicon layer 15. The photoresist film 16 is patterned using a mask so that it partially overlaps with the isolation structure 14.

The second polysilicon layer 15 is etched in a first etch chamber using the patterned photoresist film 16 as an etch mask, thus forming a floating gate in which the first and second polysilicon layers 13 and 15 are laminated. To completely remove the etch remnants of the second polysilicon layer 15, the second polysilicon layer 15 is over-etched. Accordingly, the isolation structure 14 is etched to define a trench 20 having a lower end that extends into the isolation structure.

Referring to FIG. 1B, after the photoresist film 16 is stripped, a part of the isolation structure 14 is etched again. In the present implementation, this etch step is performed in a second etch chamber. The second etch chamber for etching a part of the isolation structure 14 may be an oxide film etch chamber (for example, e-MAX available from AMAT or SCCM equipment available from TEL). If the isolation structure 14 is etched in the oxide film chamber such as the e-MAX or SCCM equipment, the etch rate of the oxide film can be raised while lowering the etch rate of the polysilicon layer.

In some embodiments, the isolation structure 14 is etched, so that a lower portion 22 of the trench 20 has sloping sidewalls. The width of the lower portion 22 of the trench 20 decreases with the increase in depth. For example, the etched lower portion 22 resembles a V shape (FIG. 1B).

An etch gas that generates polymer during the etch process is used to etch the lower portion 22. In the present implementation, a mixed gas of $CF_4$, $CHF_3$, $CF_8$, and $CH_2F_2$ is used. In other implementation, a combination of the above gases and/or other gases may be used. If the isolation structure 14 is etched using the gas, a predetermined region of the isolation structure 14 can be etched in the V shape since a polymer is generated. The conditions for etching a predetermined region of the isolation structure 14 in the V shape using the gas will be described in detail below.

An etch process is performed by introducing $CF_4$ of about 50 sccm to about 200 sccm, $CHF_3$ of about 20 sccm to about 200 sccm, $CF_8$ of about 5 sccm to about 30 sccm, and $CH_2F_2$ of about 10 sccm to about 50 sccm and then introducing argon (Ar) gas of about 100 sccm or less into the oxide film etch chamber, such as the SCCM equipment, and applying a bias of about 200 W or less. A depth of the isolation structure 14, which is etched in the V shape as described above, may have the same height as the surface height of the semiconductor substrate 11 (for example, about 100 to about 500 Å).

Meanwhile, the reason why the isolation structure 14 is etched using the oxide film etch chamber can be described as follows. If the second polysilicon layer 15 is over-etched with the photoresist film 16 remaining on the second polysilicon layer 15, the isolation structure 14 can be etched to a thickness of about 100 Å or less. However, the isolation structure 14 cannot be etched to a depth of about 100 Å or more since there is no margin of the photoresist film 16.

Referring to FIG. 1C, after a dielectric layer 17 is formed on the entire structure, a third polysilicon layer 18 for a control gate is formed. Since a predetermined portion of the isolation structure 14 is etched in the V shape, the dielectric layer 17 and the third polysilicon layer 18 are formed at the portion. Thereafter, the third polysilicon layer 18 is etched by using a photolithography process employing a control gate mask. The underlying layers are then etched to form a gate in which the floating gate and the control gate are laminated.

As described above, according to the present invention, the isolation structure, which has been partially etched when the second polysilicon layer is etched, is etched ex-situ using the oxide film etch chamber so that it has the V shape. The dielectric layer and the third polysilicon layer are formed at the V-shaped etched portion.

It is therefore possible to reduce the interference between the first polysilicon layers. Threshold voltage distributions between cells can be improved through the minimization of the interference. Furthermore, a cycling threshold voltage can be improved since the distance between the semiconductor substrate and the control gate is increased.

While the invention has been described in connection with what is presently considered to be practical exemplary embodiments, it is to be understood that the invention is not limited to the disclosed embodiments, but, on the contrary, is intended to cover various modifications and equivalent arrangements included within the spirit and scope of the appended claims.

What is claimed is:

1. A method of manufacturing a flash memory device, the method comprising:
sequentially forming a tunnel oxide film and a first polysilicon layer on an upper surface of a semiconductor substrate, and forming an isolation structure at a predetermined region on the semiconductor substrate, the upper surface of the semiconductor substrate having a first height;
forming a second polysilicon layer over the first polysilicon layer and the isolation structure;
patterning the second polysilicon layer so that the second polysilicon layer remains over the first polysilicon layer and partially overlaps with the isolation structure, wherein while the second polysilicon layer is over-etched, the isolation structure is partially etched to form a recess having a first depth in a center portion of the isolation structure, the first depth corresponding to a second height that is higher than the first height;
exposing a top surface of the patterned second polysilicon layer;
simultaneously etching an exposed side surface of the patterned second polysilicon layer, the exposed top surface of the patterned second polysilicon layer, and the recess of the isolation structure to extend the first depth of the recess to a second depth, the second depth corresponding to a third height that is equal to or lower than the first height; and
forming a dielectric layer and a third polysilicon layer over the isolation structure including the recess having the second depth and the second polysilicon layer, the third polysilicon layer filling the recess and extending at least to an adjacent isolation structure.

2. The method as claimed in claim 1, wherein the simultaneously etching step is performed using an etch chamber configured to etch oxide under the conditions in which the etch rate of the second polysilicon layer is low, but the etch rate of the isolation structure is high.

3. The method as claimed in claim 1, wherein in the simultaneously etching step, the isolation structure is etched to have a V-like shape.

4. The method as claimed in claim 1, wherein the simultaneous etching is performed using a mixed gas including $CF_4$, $CHF_3$, $CF_8$, and $CH_2F_2$.

5. The method as claimed in claim 1, wherein the simultaneously etching step is performed by introducing $CF_4$ of about 50 sccm to about 200 sccm, $CHF_3$ of about 20 sccm to about 200 sccm, $CF_8$ of about 5 sccm to about 30 sccm, and $CH_2F_2$ of about 10 sccm to about 50 sccm and then introducing argon (Ar) gas of about 100 sccm or less into an oxide film etch chamber, and applying a bias of about 200 W or less.

6. A method of manufacturing a flash memory device, the method comprising:
forming a tunnel dielectric film over an upper surface of a semiconductor substrate and a first polysilicon layer over the tunnel dielectric film, the upper surface of the semiconductor substrate having a first height;
forming an isolation structure at a predetermined region on the semiconductor substrate;
forming a second polysilicon layer over the isolation structure and the first polysilicon layer;
patterning the second polysilicon layer so that the second polysilicon layer remains over the first polysilicon layer and partially overlaps with the isolation structure, wherein while the second polysilicon layer is over-etched, the isolation structure is partially etched to form a first etched portion to form a recess having a first depth in a center portion of the isolation structure, the first depth corresponding to a second height that is higher than the first height;
exposing a top surface of the patterned second polysilicon layer;
simultaneously etching an exposed side surface of the patterned second polysilicon layer, the exposed top surface of the patterned second polysilicon layer, and the recess of the isolation structure to extend the first depth of the recess to a second depth, the second depth corresponding to a third height that is equal to or lower than the first height; and
forming a dielectric layer and a third polysilicon layer over the entire structure including the recess having the second depth within the isolation structure, the isolation structure dividing the first polysilicon layer into a plurality of portions.

7. The method as claimed in claim 6, wherein the isolation structure is etched to have a V-like shape when the recess is extended to the second depth, wherein the isolation structure, which has been partially etched when the second polysilicon layer is etched, is etched ex-situ using an oxide film etch chamber to form the V-shaped etched portion.

8. A method for forming a non-volatile memory device, the method comprising:
sequentially forming a tunnel oxide film and a first polysilicon layer on a surface of a semiconductor substrate;
etching a portion of the first polysilicon layer, the tunnel oxide film and the substrate to form a trench;
forming an insulating layer in the trench to form an isolation structure;
forming a second polysilicon layer over a resulting structure after forming the isolation structure;
patterning the second polysilicon layer so that the second polysilicon layer remains over the first polysilicon layer and is partially overlapped with the isolation structure, wherein while the second polysilicon layer is over-etched, the isolation structure is partially etched to form a recess in a center portion of the isolation structure;
exposing a top surface of the patterned second polysilicon layer;
simultaneously etching an exposed side surface of the patterned second polysilicon layer, the exposed top surface of the patterned second polysilicon layer, and the recess so that a depth of the recess extends at least to a depth corresponding to a surface of the semiconductor substrate;
forming a dielectric layer and a third polysilicon layer over the isolation structure and the second polysilicon layer, thereby forming the dielectric layer and the third polysilicon layer within the isolation structure between the first polysilicon layers divided by the isolation structure.

9. The method of claim 8, wherein the first etch step uses an etch gas that generates polymer during the etching process.

10. The method of claim 8, wherein the etch gas of the second etch step includes $CF_4$, $CHF_3$, $CF_8$, or $CH_2F_2$.

11. The method of claim 8, wherein the etch gas of the second etch step includes a combination of gases selected from $CF_4$, $CHF_3$, $CF_8$, and $CH_2F_2$.

12. The method as claimed in claim 1, wherein a surface height of the first polysilicon layer is lower than a surface height of the isolation structure overlapped with the second polysilicon layer.

13. The method of claim 1, wherein a plurality of isolation structures are provided, each isolation structure having a recess having the second depth,
    wherein the first polysilicon layer resides substantially between two adjacent isolation structures and the second polysilicon layer is provided directly over the first polysilicon layer, and
    wherein the dielectric layer and the third polysilicon layer are formed over the isolation structures, the first polysilicon layer residing substantially between the two adjacent isolation structures, and the second polysilicon layer provided directly over the first polysilicon layer.

14. The method as claimed in claim 6, wherein a surface height of the first polysilicon layer is lower than a surface height of the isolation structure overlapped with the second polysilicon layer.

15. The method of claim 6, wherein a plurality of isolation structures are provided, each isolation structure having a recess having the second depth,
    wherein the first polysilicon layer resides substantially between two adjacent isolation structures and the second polysilicon layer is provided directly over the first polysilicon layer, and
    wherein the dielectric layer and the third polysilicon layer are formed over the isolation structures, the first polysilicon layer residing substantially between the two adjacent isolation structures, and the second polysilicon layer provided directly over the first polysilicon layer.

16. The method of claim 8, wherein a surface height of the first polysilicon layer is lower than a surface height of the isolation structure overlapped with the second polysilicon layer.

* * * * *